United States Patent
Wang

(10) Patent No.: US 10,242,863 B2
(45) Date of Patent: Mar. 26, 2019

(54) SUBSTRATE PROCESSING APPARATUS

(71) Applicants: WET Technology Co., Ltd., Hsinchu (TW); Yi-Cheng Wang, Hsinchu (TW)

(72) Inventor: Yi-Cheng Wang, Hsinchu (TW)

(73) Assignees: WET TECHNOLOGY CO., LTD., Hsinchu (TW); Yi-Cheng Wang, Hsinchu (TW)

(*) Notice: Subject to any disclaimer, the term of this patent is extended or adjusted under 35 U.S.C. 154(b) by 162 days.

(21) Appl. No.: 15/283,923

(22) Filed: Oct. 3, 2016

(65) Prior Publication Data
US 2018/0096837 A1  Apr. 5, 2018

(51) Int. Cl.
| H01L 21/02 | (2006.01) |
| H01L 21/768 | (2006.01) |
| H01L 21/683 | (2006.01) |
| H01L 21/67 | (2006.01) |

(52) U.S. Cl.
CPC ........ H01L 21/02068 (2013.01); H01L 21/67 (2013.01); H01L 21/6835 (2013.01); H01L 21/76814 (2013.01); H01L 2221/68381 (2013.01)

(58) Field of Classification Search
CPC ......... H01L 21/02068; H01L 21/76814; H01L 21/6835; H01L 21/67; H01L 2221/68381
See application file for complete search history.

(56) References Cited

U.S. PATENT DOCUMENTS

| 8,334,461 | B2 | 12/2012 | Taguchi et al. | |
| 2005/0092351 | A1* | 5/2005 | Saito et al. | 134/33 |
| 2007/0082496 | A1* | 4/2007 | Orii et al. | 438/737 |
| 2009/0011605 | A1* | 1/2009 | Chiba et al. | 438/716 |
| 2013/0000684 | A1* | 1/2013 | Soma et al. | 134/36 |
| 2013/0327463 | A1* | 12/2013 | Kitahara et al. | 156/64 |
| 2014/0076500 | A1* | 3/2014 | Honda et al. | 156/750 |
| 2014/0150980 | A1* | 6/2014 | Itou et al. | 156/714 |
| 2014/0150981 | A1* | 6/2014 | Itou et al. | 156/714 |

FOREIGN PATENT DOCUMENTS

| TW | I297537 B | 6/2008 |
| TW | I405257 B | 8/2013 |
| TW | I407536 B | 9/2013 |

* cited by examiner

*Primary Examiner* — Michael E Barr
*Assistant Examiner* — Benjamin L Osterhout
(74) *Attorney, Agent, or Firm* — Muncy, Geissler, Olds & Lowe, P.C.

(57) ABSTRACT

A substrate processing apparatus for processing a wafer including a temporary substrate and a semiconductor device. The substrate processing apparatus includes a first half portion, a second half portion and a liquid supply unit. The first half portion includes a working platform. The second half portion includes an upper cover having a first surface and a plurality of second holes. The liquid supply unit provides a liquid. The wafer is placed on the working platform, and a second surface of the semiconductor device and the first surface are spaced by a distance sufficient for allowing the liquid to come into contact with the first surface when the liquid flows at the second surface to generate a suction force on the second surface. As such, a peel force is formed between the temporary substrate and the semiconductor device to cause the two to separate from each other.

10 Claims, 3 Drawing Sheets

SUBSTRATE PROCESSING APPARATUS

FIELD OF THE INVENTION

The present invention relates to a substrate processing apparatus, and particularly to a low-cost substrate processing apparatus.

BACKGROUND OF THE INVENTION

Semiconductor devices are one of essential components in many electrical appliances and electronic products, and are completed through numerous fabrication steps by precision apparatuses in a fabrication process.

For example, the U.S. Pat. No. 8,334,461 B2 discloses a wiring board adapted for mounting an electronic component. The wiring board includes a plurality of wiring layers, a wiring forming region and a surrounding region. The wiring layers include an insulating layer interposed therebetween. The wiring forming region is defined by a part corresponding to a region in which the electronic component is to be mounted. The surrounding region surrounds the wiring forming region.

For another example, the Taiwan Patent No. 1407536 discloses a method for manufacturing a heat bulk of a semiconductor device. The method includes: forming an electrically conductive layer to cover a surface of a temporary substrate; connecting at least one semiconductor chip to the electrically conductive layer by at least one metal bump, wherein the at least one metal bump is located between the at least one semiconductor chip and the electrically conductive layer; forming a metal substrate on the electrically conductive layer, wherein the metal substrate fills up a gap between the at least one semiconductor chip and the electrically conductive layer; and removing the temporary substrate.

For another example, the Taiwan Patent No. 1297537 discloses an embedded metal heat sink for a semiconductor device. The embedded metal heat sink for a semiconductor device includes a metal thin layer, at least one semiconductor device, a metal heat sink, and two electrode bonding pads. The metal think layer includes a first surface and a second surface at opposite sides. The at least one semiconductor device is embedded in the first surface of the metal thin layer, and has two electrodes with different conductivity types. The metal heat sink is deposited on the second surface of the metal thin layer. The two electrode bonding pads are respectively corresponding to the electrodes and are disposed on the first surface of the metal thin layer around the semiconductor device to electrically connect to an external circuit, wherein the electrodes are electrically and respectively connected to the corresponding electrode bonding pads by at least two wires.

For another example, the Taiwan Patent No. 1405257 discloses a method for separating an epitaxial substrate from a semiconductor layer. The method includes steps of: providing a temporary substrate; forming a patterned silicon dioxide layer on the temporary substrate; growing a semiconductor layer on the patterned silicon dioxide layer; forming a metal mirror on the semiconductor layer; performing first etching on the patterned silicon dioxide layer; and performing second etching on an interface between the temporary substrate and the semiconductor layer to remove the temporary substrate.

Among the above known technologies, the U.S. Pat. No. 8,334,461 performs a wet etching process to completely remove the temporary substrate by using a large amount of wet etching agent before the wiring board is to be formed. However, this method has increased production costs as it consumes a large amount of wet etching agent. The Taiwan Patent No. 1407536 removes the temporary substrate by means of grinding or laser stripping. However, the grinding means needs to completely grind off the entire temporary substrate, hence incurring the issue of a time-consuming fabrication process; the laser stripping means not only needs to be performed using precise, expensive and electricity-consuming apparatuses but also likely damages the semiconductor structure during the process and thus increases production costs. Further, in the Taiwan Patent No. 1297537, as the metal thin layer and the optoelectronic component are adhered to the temporary substrate by an adhesive tape, the metal thin layer and the optoelectronic component may be separated from the temporary substrate by removing the adhesive tape. However, such separation method likely causes residual macromolecules of the adhesive type on the temporary substrate or component, and result in pollution. Further, the Taiwan Patent No. 1405257 also adopts wet etching to separate the temporary substrate and the semiconductor layer, and thus has the similar issue and drawback of increased production costs.

SUMMARY OF THE INVENTION

Therefore, an object of the present invention is to solve issues of conventional semiconductor fabrication processes, which are high production costs owning to a large amount of chemical agent consumption and the need for a precision, costly and electricity-consuming instrument to remove a temporary substrate.

To achieve the above object, the present invention provides a substrate processing apparatus for processing a wafer including a temporary substrate and a semiconductor formed at one side of the temporary substrate. The substrate processing apparatus includes a first half portion, a second half portion and a liquid supply unit. The first half portion includes a working platform, and a first hole disposed at the working platform. The second half portion is disposed above the first half portion, and includes an upper cover corresponding to the working platform to form an accommodating space for accommodating the wafer, and a plurality of second holes disposed at the upper cover. The upper cover includes a first surface located above the working platform and for disposing the second holes. The liquid supply unit is in communication with the first hole and the second holes, and supplies a liquid to the accommodating space. The wafer is placed on the working platform, and a second surface of the semiconductor device and the first surface are spaced by a distance, which is sufficient for allowing the liquid to come into contact with the first surface when the liquid flows at the second surface to generate a suction force on the second surface. As such, a peel force is formed between the temporary substrate and the semiconductor device to cause the temperature and the semiconductor device to separate from each other.

It is known from the above that, compared to known technologies, the present invention has the following effects. In the present invention, the liquid supply unit supplies a liquid. When the liquid is in a flowing state, a stable laminar flow is generated in a long and narrow space between the first surface and the second surface to define a flow field. Based on the Bernoulli effect that when two planes are approaching (i.e., the first surface and the second surface of the present invention), if a fluid ejects from one of the planes and flows within the interface of the two planes, a pressure difference is formed between the top and the bottom of the wafer, such that the flow field produces a dynamic upward suction force on the second surface. Further, when the liquid is in a still state, which means at a time period when the liquid supply unit stop supplying the liquid, based on the capillary effect, the liquid in the long and narrow space produces a static upward suction force on the second surface to cause the temporary substrate and the semiconductor device to separate from each other. Hence, there is no need to soak the entire wafer in a large amount of chemical solution, or to use a precise, costly and electricity-consuming instrument to separate a temporary substrate from a semiconductor device as the convention processes, thereby reducing the production costs.

DETAILED DESCRIPTION OF THE PREFERRED EMBODIMENTS

Figure 1A:
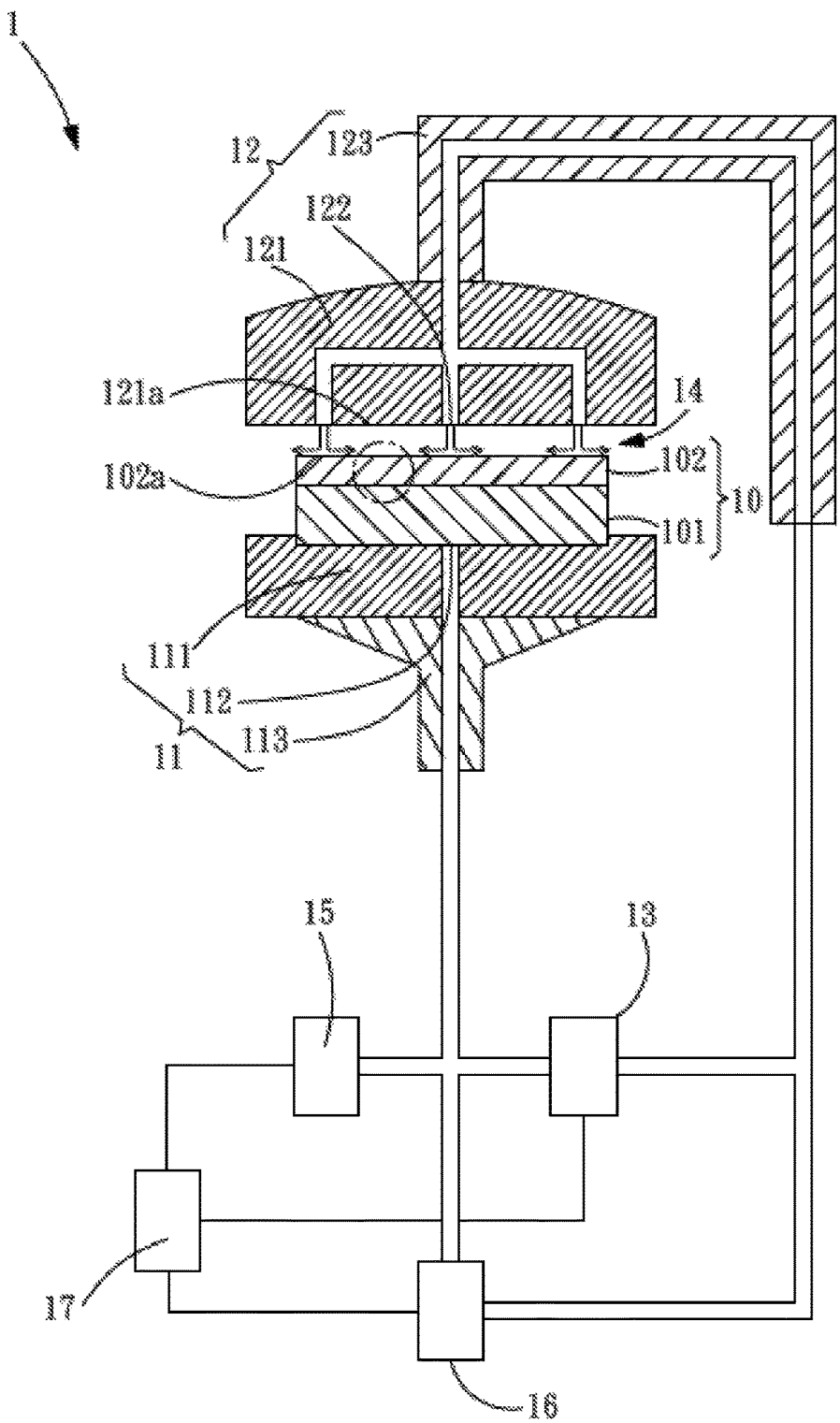
FIG. 1A is a schematic diagram of a substrate processing apparatus according to an embodiment of the present invention.

Details and technical contents of the present invention are given with the accompanying drawings below.

FIG. 1 shows a schematic diagram of a substrate processing apparatus according to an embodiment of the present invention. Referring to FIG. 1, a substrate processing apparatus 1 of the present invention is adapted to process a wafer 10 including a temporary substrate 101 and a semiconductor device 102 formed at one side of the temporary substrate 101. The substrate processing apparatus 1 includes a first half portion 11, a second half portion 12 and a liquid supply unit 13. The first half portion 11 includes a working platform 111, and a first hole 112 disposed at the working platform 111. The second half portion 12 is disposed above the first half portion 11, and includes an upper cover 121 and a plurality of second holes 122 disposed at the upper cover 121. The upper cover 121 includes a first surface 121a, which is located above the working platform 111 and for disposing the second holes 122. Between the upper cover 121 and the working platform 111 forms an accommodating space 14 for accommodating the wafer 10.

The liquid supply unit 13 is in communication with the first hole 112 and the second holes 122, and supplies a liquid to the accommodating space 14. In the present invention, for example, the liquid is water or a highly volatile solvent having a low viscosity coefficient, e.g., isopropyl alcohol (IPA). In the present invention, for example, the second holes 122 are in a quantity of three. In other embodiments, the second holes 122 are not limited to this exemplary quantity, and may be in other quantities based on application requirements.

In the embodiment, the substrate processing apparatus 1 further includes an elevating rotary member 113 disposed at the working platform 111, an elevating member 123 connected to the upper cover 121, a vacuum unit 15 in communication with the first hole 112, a gas supply unit 16 in communication with the first hole 112 and the second holes 122 and supplying a gas to the accommodating space 14, and a control unit 17 electrically connected to the liquid supply unit 13, the vacuum unit 15 and the gas supply unit 16. In the present invention, for example, the gas may be air.

In practice, the wafer 10 is placed in the accommodating space 14 between the working platform 111 and the upper cover 121. The elevating member 123 controls the upper cover 121 to correspondingly operate on the working platform 111. The control unit 17 controls the gas supply unit 16, the liquid supply unit 13 and the vacuum unit 15 to operate. For example, the control unit 17 controls the vacuum unit 15 to vacuum the accommodating space 14. In the present invention, the vacuum unit 15 may form a vacuum state between the first hole 112 and the temporary substrate 101 of the wafer 10 to further cause the wafer 10 to be secured on the working platform 111. Alternatively, the control unit 17 controls the gas supply unit 16 to input the gas through the first hole 112 and the second holes 122 to perform a cleaning operation. The control unit 17 may further control the liquid supply unit 13 to provide the liquid for processing the wafer 10. More specifically, through the second holes 122, the liquid is provided onto a second surface 102a of the semiconductor device 102. The first surface 121a of the upper cover 121 and the second surface 102a of the semiconductor device 102 are spaced by a distance, which is sufficient for allowing the liquid to come into contact with the first surface 121a when the liquid flows at the second surface 102a to generate a suction force on the second surface 102a. The distance of the first surface 121a of the upper cover 121 and the second surface 102a of the semiconductor device 102, for example, may be 0.01 to 2 mm, and may preferably be 0.5 mm to 1.5 mm; however, the present invention is not limited thereto. As such, a peel force is formed between the temporary substrate 101 and the semiconductor device 102 to cause the temporary substrate 101 and the semiconductor device 102 to separate from each other. More specifically, with the suction force formed, when the liquid is in a flowing state, a stable laminar flow is generated in a long and narrow space between the first surface 121a and the second surface 102a to further define a flow field. Based on the Bernoulli effect that when two planes are approaching (i.e., the first surface 121a and the second surface 102a of the present invention), if a fluid ejects from one of the planes and flows within the interface of the two planes, a pressure difference is generated between the top and bottom of the wafer 10 such that the flow field produces a dynamic upward suction force on the second surface 102a. When the liquid is in a still state (i.e., the liquid supply unit 13 stops supplying the liquid), the liquid in the long and narrow space produces a static upward suction force on the second surface 102a based on the capillary effect.

Figure 1B:
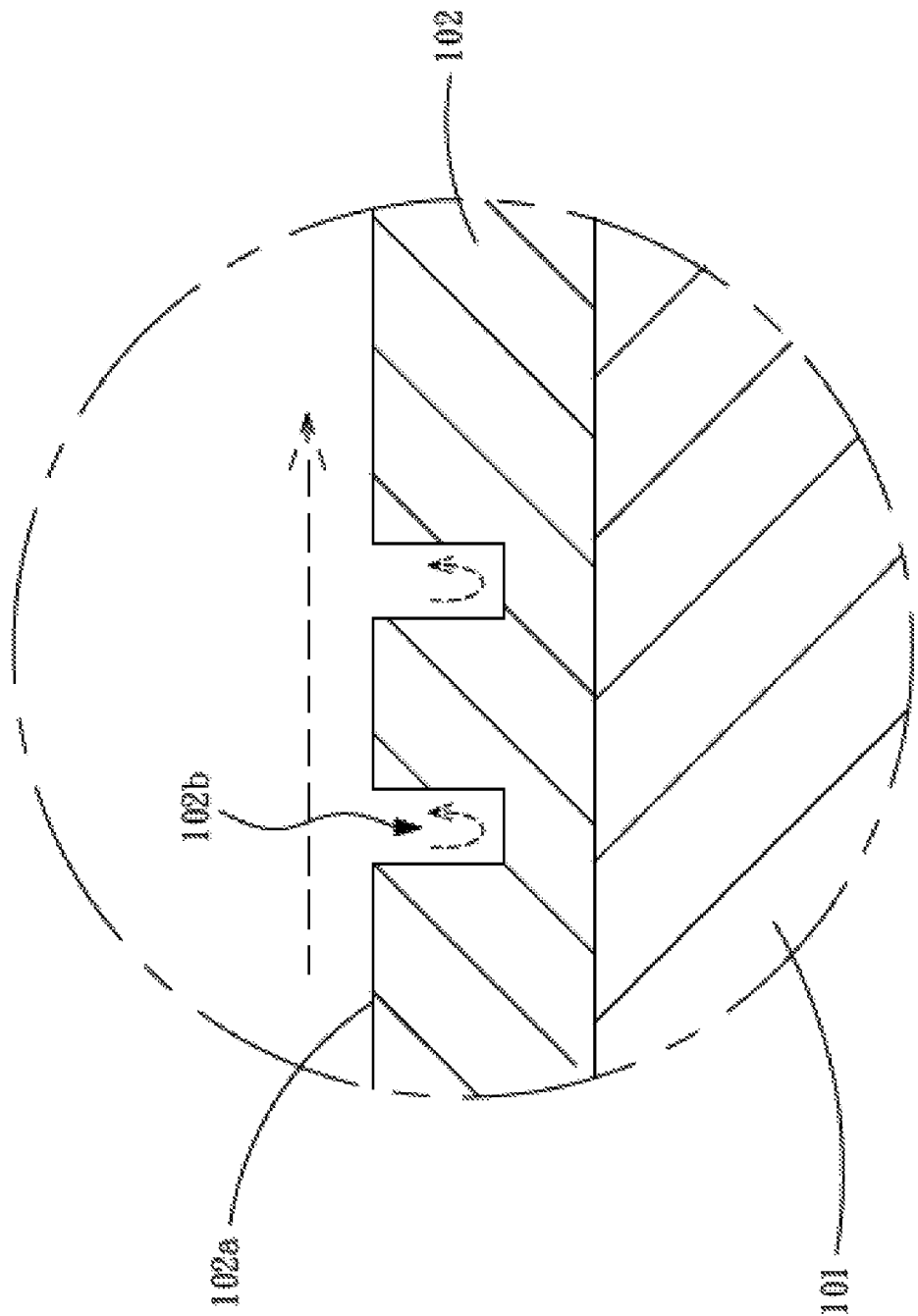
FIG. 1B is a partial enlarged view of FIG. 1A.

FIG. 1B shows a partial enlarged view of FIG. 1A. In a situation where the semiconductor device 102 includes one via hole 102b, when the liquid or the gas rapidly passes on the second surface 102a of the semiconductor device 102, a flow field as shown by the arrows is formed in the via hole 102b. Due to partial vacuum produced in the via hole 102b, dirt in the via hole 102b is taken away to achieve a cleaning effect. The via hole 102b may be a buried via hole (BVH) or a blind via hole (BVH).

Figure 2:
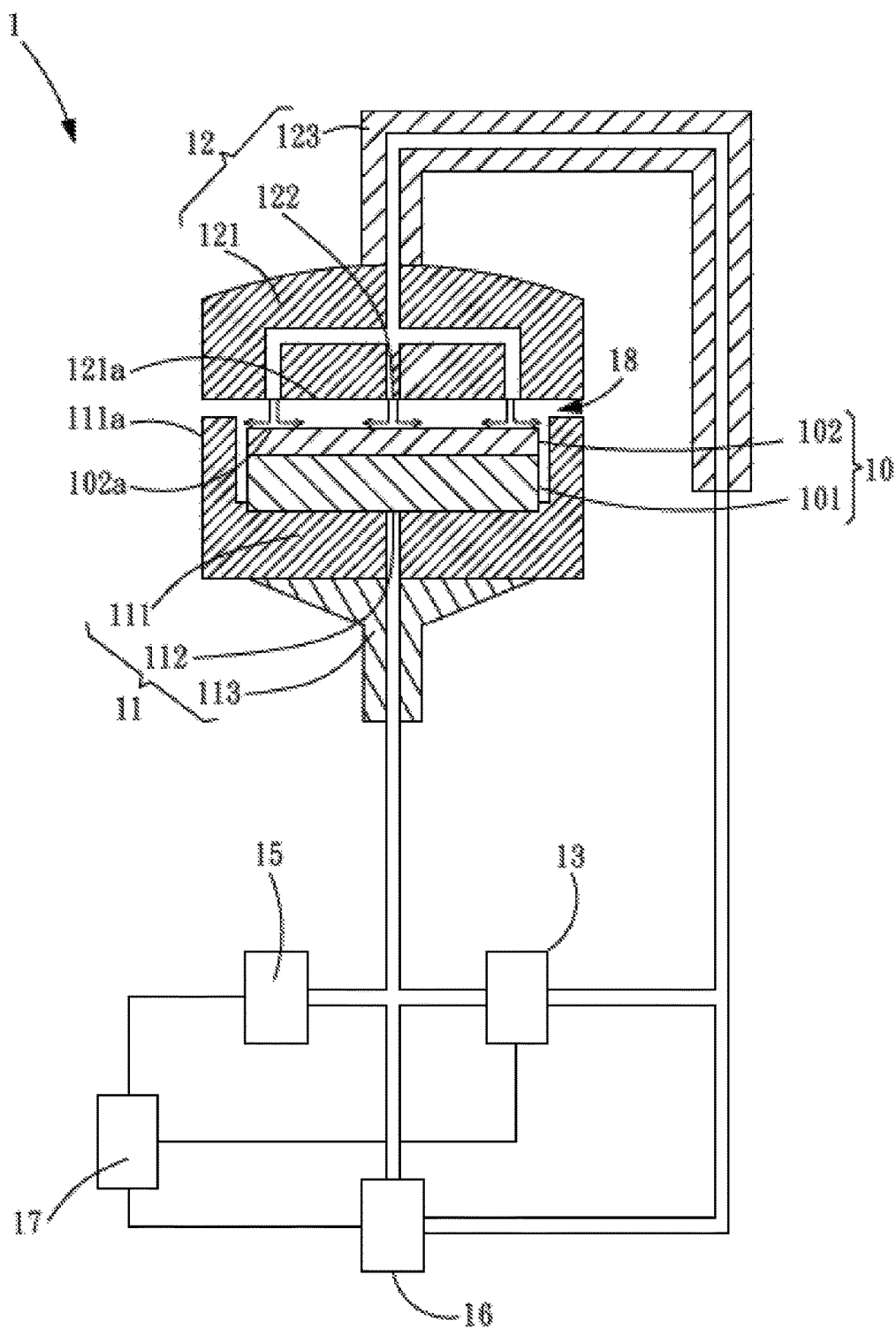
FIG. 2 is a schematic diagram of a substrate processing apparatus according to another embodiment of the present invention.

FIG. 2 shows a schematic diagram of a substrate processing apparatus according to another embodiment of the present invention. Referring to FIG. 2, a difference of the substrate processing apparatus from the substrate processing apparatus 1 in FIG. 1 is that, the first half portion 11 further includes a blocking wall 111a that extends upwards from an edge of the working platform 111. As such, a small cavity 18 is formed by the first half portion 11 and the second half portion 12. The small cavity 18 prevents the liquid or the gas from overflowing during operations.

In conclusion, in the present invention, the liquid supply unit supplies a liquid. When the liquid is in a flowing state, a stable laminar flow is generated within a long and narrow space between the first surface and the second surface to define a flow field. Based on the Bernoulli effect that when two planes are approaching (for example, the first surface and the second surface of the present invention), if a fluid ejects from one of the planes and flows within the interface of the two planes, a pressure difference is formed between the top and the bottom of the wafer, such that the flow field produces a dynamic upward suction force on the second surface. When the liquid is in a still state, based on the capillary effect, the liquid in the long and narrow space produces a static upward suction force on the second surface to cause the temporary substrate and the semiconductor device to separate from each other. Furthermore, if the semiconductor device have fine roughness or pores, a pressure change will occur due to a speed change when the fluid flowing through the fine roughness or holes of the semiconductor device. The phenomenon, which is also known as cavitation, may accelerate the erosion rate of the roughness or holes, and thus, an enhanced cleaning ability as well as a drying function can be realized.

Hence, compared with the conventional solutions that soaking the entire wafer in a large amount of chemical solution or processing the wafer by a precise, costly and electricity-consuming instrument, the present invention can efficiently separating a temporary substrate from a wafer by combining the Bernoulli and the cavitation effects, thereby reducing production costs.

What is claimed is:

1. A substrate processing apparatus, for processing a wafer comprising a temporary substrate and a semiconductor device formed at one side of the temporary substrate, the substrate processing apparatus comprising:
   a first half portion, comprising a working platform for the wafer to be placed thereon and in contact with the temporary substrate, and a first hole disposed at the working platform;
   a second half portion, disposed above the first half portion, comprising an upper cover corresponding to the working platform to form an accommodating space for accommodating the wafer and a plurality of second holes disposed at the upper cover, wherein the upper cover comprises a first surface for disposing the second holes and facing with a second surface of the wafer on the working platform, which is located on the semiconductor device and opposite to the temporary substrate, wherein the first surface of the upper cover and the second surface of the semiconductor device are spaced by a distance, which is ranged from 0.01 mm to 2 mm; and
   a liquid supply unit, in communication with the first hole and the second holes, supplying a liquid to the accommodating space;
   wherein when the liquid flows from the first surface to the second surface, a suction force is generated between the first surface and the second surface via the Bernoulli effect to make the first surface come into contact with the second surface; meanwhile a peel force is generated between the temporary substrate and the semiconductor device to cause the temporary substrate and the semiconductor device to separate from each other.

2. The substrate processing apparatus of claim 1, further comprising a gas supply unit, which is in communication with the first hole and the second holes and provides a gas.

3. The substrate processing apparatus of claim 2, wherein the liquid passes the second surface of the semiconductor device, and produces partial vacuum in a via hole of the semiconductor device to form a flow field that cleans the via hole.

4. The substrate processing apparatus of claim 2, wherein the gas is air.

5. The substrate processing apparatus of claim 1, wherein the liquid is water or isopropyl alcohol (IPA).

6. The substrate processing apparatus of claim 1, further comprising a vacuum unit in communication with the first hole.

7. The substrate processing apparatus of claim 1, further comprising a control unit electrically connected to the liquid supply unit.

8. The substrate processing apparatus of claim 1, wherein the first half portion further comprises an elevating rotary member disposed at the working platform.

9. The substrate processing apparatus of claim 1, wherein the second half portion further comprises an elevating member connected to the upper cover.

10. The substrate processing apparatus of claim 1, wherein the liquid passes the second surface of the semiconductor device, and produces partial vacuum in a via hole of the semiconductor device to form a flow field that cleans the via hole.

* * * * *